(12) United States Patent
Shau

(10) Patent No.: US 6,735,755 B2
(45) Date of Patent: May 11, 2004

(54) COST SAVING METHODS USING PRE-DEFINED INTEGRATED CIRCUIT MODULES

(76) Inventor: Jeng-Jye Shau, 13445 Mandoli Dr., Los Altos Hills, CA (US) 94022

(*) Notice: Subject to any disclaimer, the term of this patent is extended or adjusted under 35 U.S.C. 154(b) by 0 days.

(21) Appl. No.: 09/817,936

(22) Filed: Mar. 27, 2001

(65) Prior Publication Data

US 2002/0004932 A1 Jan. 10, 2002

Related U.S. Application Data

(60) Provisional application No. 60/192,363, filed on Mar. 27, 2000.

(51) Int. Cl.$^7$ .................. H01L 23/14; H01L 23/52; H01L 27/10
(52) U.S. Cl. .................. 716/16; 257/203; 326/41
(58) Field of Search .................. 716/16; 257/202, 257/203, 211; 327/565; 326/101, 40, 41

(56) References Cited

U.S. PATENT DOCUMENTS

| 5,386,623 | A | * | 2/1995 | Okamoto et al. | 29/832 |
| 5,430,734 | A | * | 7/1995 | Gilson | 714/725 |
| 5,512,765 | A | * | 4/1996 | Gaverick | 257/202 |
| 5,760,478 | A | * | 6/1998 | Bozso et al. | 257/777 |
| 6,157,213 | A | * | 12/2000 | Voogel | 326/41 |

* cited by examiner

Primary Examiner—Tuan T. Lam
Assistant Examiner—Terry L. Englund
(74) Attorney, Agent, or Firm—Bo-In Lin

(57) ABSTRACT

This invention discloses a multiple-chip module (MCM) device supported on a semiconductor wafer. The MCM device includes a core module that has a plurality of logic circuits having a layer structure formed by a logic circuit manufacturing process for performing logic functions of said MCM device. The MCM device further includes at least an input/output (I/O) module disposed next to and separate from the core module comprising a plurality of I/O circuits having a layer structure formed by an I/O circuit manufacturing process for performing input/output functions for said MCM device. The core module is flipped to have face-to-face contacts with a plurality of inter-module contact points disposed on the I/O module.

7 Claims, 10 Drawing Sheets

COST SAVING METHODS USING PRE-DEFINED INTEGRATED CIRCUIT MODULES

This Application claims a priority date of Mar. 27, 2000 benefited from a previously filed Provisional Patent Application No. 60/192,363 filed on Mar. 27, 2000.

BACKGROUND OF THE INVENTION

The present invention relates to integrated circuit (IC) design methods, and more particularly to cost and time saving IC design methods using pre-defined reusable modules.

IC manufacture technologies have been progressing in astonishing rates. Critical dimensions of IC technologies are reduced by one generation in every 18 months. Currently 0.18 μm (micrometers) technology is ready for mass production, while 0.13 or 0.09 μm technologies are on the way. These advanced technologies require super-fine resolution lithography masks to define the physical layout of circuits. The price of masks increases dramatically when critical dimension decreases. A typical mask set costs about $50 thousands for 0.35 μm technology, $500 thousands for 0.25 μm technology, and it is expected to cost more than $2 millions for future technologies. As IC manufacture technologies and IC designs are getting more and more complex, many products need to tape out multiple mask sets before they are ready for mass production. The costs for lithography masks become a heavy burden for IC manufacturers.

One common method to reduce this burden is to share the mask cost with other products at early developing stages. Multiple products designed by different companies are bundled together to share one mask set. After wafer production, each company obtains a small number of prototype devices for testing purpose. In order to collect enough designs to share the cost, such bundled productions are executed once every now and then. The waiting periods range from a few weeks to a few months. In the fast paced IC industry, the delay caused by such waiting may cost more than the money saved. Besides, we still need to pay for a complete mask set after the prototype is proven to be ready for mass production. This method is therefore useful only for limited cases.

The concept of pre-defined gate array modules was developed more than one decade ago as a cost saving method. A gate array contains a large number of transistors arranged in a pre-defined array structure. It is known that any logic equation can be translated into a gate array with proper metal connections. Products with different logic functions can be placed on the same gate array structure with different metal connections. It is therefore possible to share all the front-end manufacture procedures and masks. Individual user only needs to design and pay for metal masks. The gate array modules can be manufactured ahead of time by finishing all the front-end processes. An individual user only need to wait for back-end processing, saving the time needed for front-end wafer processing steps. This concept looked promising, but very few products were actually made by pre-manufactured gate array modules. The reason is simple. FIG. 1 shows the layout of a typical IC chip. This chip contains a core circuit (101) block that is usually a combination of logic circuit modules (102) and memory modules (103). It also contains peripheral modules (104) such as input/output (I/O) devices (105), and bounding pads (107). The edges of the product are surrounded by seal rings (109). The seal rings are metal walls use to block moisture penetration. Out of the seal ring we need to reserve scribe lanes (108) for wafer cutting. It is true that almost any kind of logic circuit can be implemented by a gate array. If IC products can have nothing but logic circuits, it would be true that most of the resources can be shared. However, a prior art product needs all the other supporting structures. It is difficult to pre-define a complete module, including gate array and I/O devices, that can fit the requirements of many products simultaneously. For example, if we pre-manufacture a gate array module that has 200 thousand gates and 32 I/O pads. A product that needs 190 thousand gates and 28 I/O pads will fit nicely. However, a product that has 201 thousand gates or a product that has 33 I/O pads will need a larger gate array module. A product that has 120 thousand gates and 16 I/O will fit but there is a lot of waste. It is unlikely for any product to fit a particular pre-defined module exactly; most of time we need to select an unnecessary large pre-defined gate array module with a lot of wasted resource. One solution for the problem is to provide multiple pre-defined modules. Each product can select the module with the best fit. Assume that a company provides 4 pre-defined gate array modules. Each module has a pre-defined gate array and supporting I/O. These 4 modules are pre-defined and pre-manufactured. The front-end manufacture procedures are finished, while the customers only need to add metal lines to finish their products. The number of gates and the number of I/O pads for those modules are chosen so that they can adapt for different products as listed in the following table. Module name Gate number I/O number

| Module name | Gate number | I/O number |
| --- | --- | --- |
| Module 1 | 256K | 64 |
| Module 2 | 512K | 128 |
| Module 3 | 1M | 208 |
| Module 4 | 2M | 256 |

Now assume that there are 8 different customer products. These products provide different logic functions so that they require different number of gates and I/O pads. The designers use the pre-defined gate array module with the lowest cost to fit their designs, as shown in the following table:

| Product | Gate number | I/O number | Chosen module | % gate used | % I/O used |
| --- | --- | --- | --- | --- | --- |
| A | 180K | 32 | 1 | 70% | 50% |
| B | 380K | 72 | 2 | 74% | 56% |
| C | 508K | 128 | 2 | 99% | 100% |
| D | 1.34M | 156 | 4 | 67% | 61% |
| E | 1.68M | 256 | 4 | 84% | 100% |
| F | 1.04M | 128 | 4 | 52% | 50% |
| G | 512K | 68 | 2 | 100% | 53% |
| H | 274K | 212 | 3 | 14% | 83% |

Only product C in the above example fully utilizes the resources provided by the pre-defined module it chooses. There are a lot of wasted resources for all the other products because they are forced to choose from pre-defined modules. Although we can save cost and time by using pre-defined modules, we are forced to pay for wasted resources. One possible solution is to define more modules, but that means we need to use more mask sets, which defeats the original cost saving purpose. Most products actual chose to use a full mask set to achieve optimum use in silicon area for mass production. Prior art pre-defined gate array modules are therefore useless except for a few special cases. It is therefore strongly desirable to have a pre-defined module that can be shared by many products while achieving high utilization rate for all individual products.

SUMMARY OF THE INVENTION

The primary objective of this invention is, therefore, to provide cost saving methods for designing integrated circuits. Another primary objective is to shorten manufacture time of IC products. The other objective is to provide effective supporting technologies, including testing, packaging, and input/output (I/O) methods, for products of the present invention. It is also a major objective of the present invention to shorten time-to-market for IC products using advanced manufacture technologies. These and other objectives are accomplished by novel pre-defined IC modules that are shared by many products without sacrificing utilization rate for individual products.

While the novel features of the invention are set forth with particularly in the appended claims, the invention, both as to organization and content, will be better understood and appreciated, along with other objects and features thereof, from the following detailed descriptions taken in conjunction with the drawings.

DETAILED DESCRIPTION OF THE INVENTION

Figure 1:
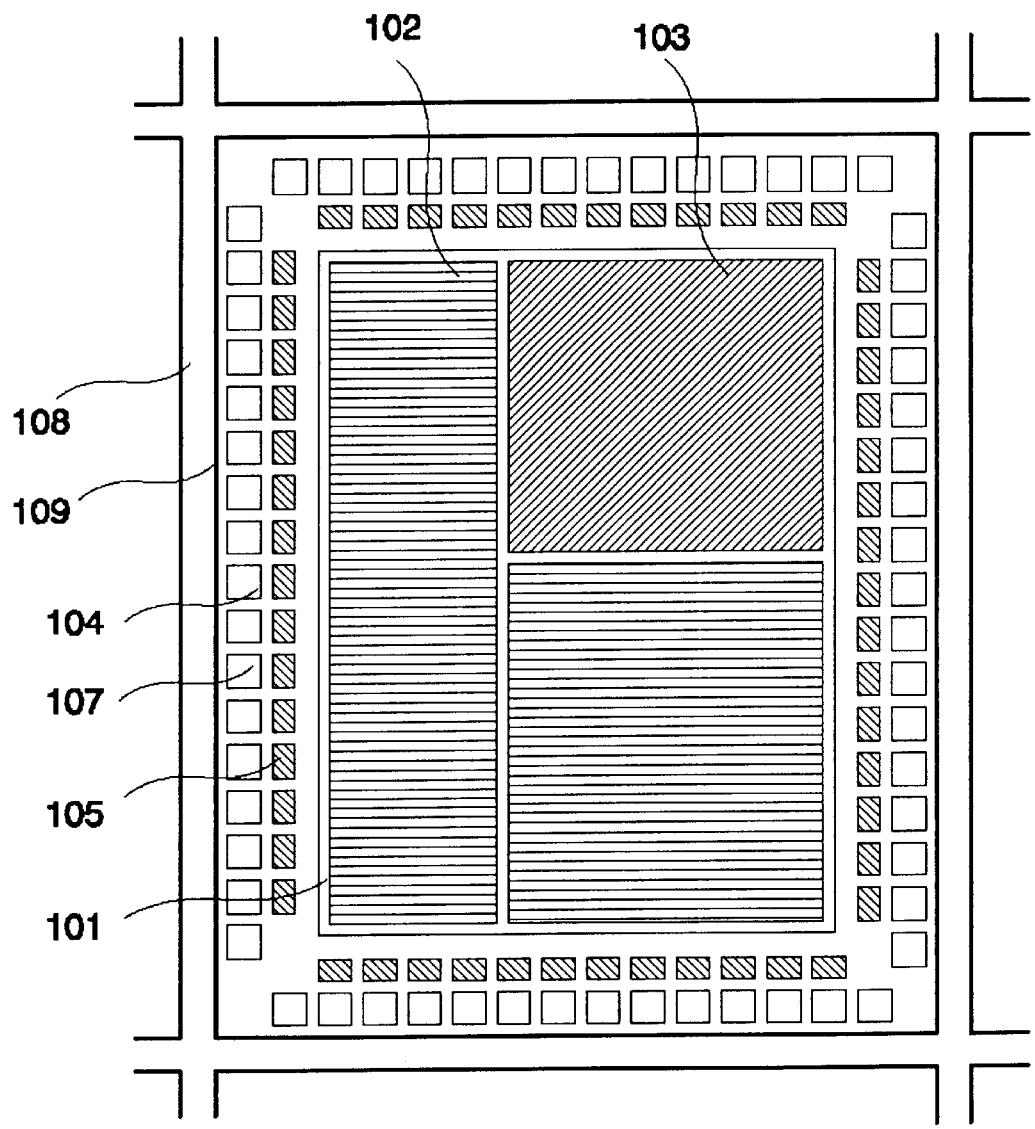
FIG. 1 shows typical layout of a prior art IC chip.

For a prior art gate array module, the frond-end layout for peripheral structures such as I/O devices (105), bounding pads (107), seal rings (109), and scribe lanes (108) are different from the front-end layout of core circuits (101). As shown in FIG. 1, for each block of silicon area reserved for core circuit (101), we must surround it with peripheral modules (104). Therefore, a prior art pre-defined circuit module must have a fixed number of gates and a fixed number of I/O devices.

Figure 2A:
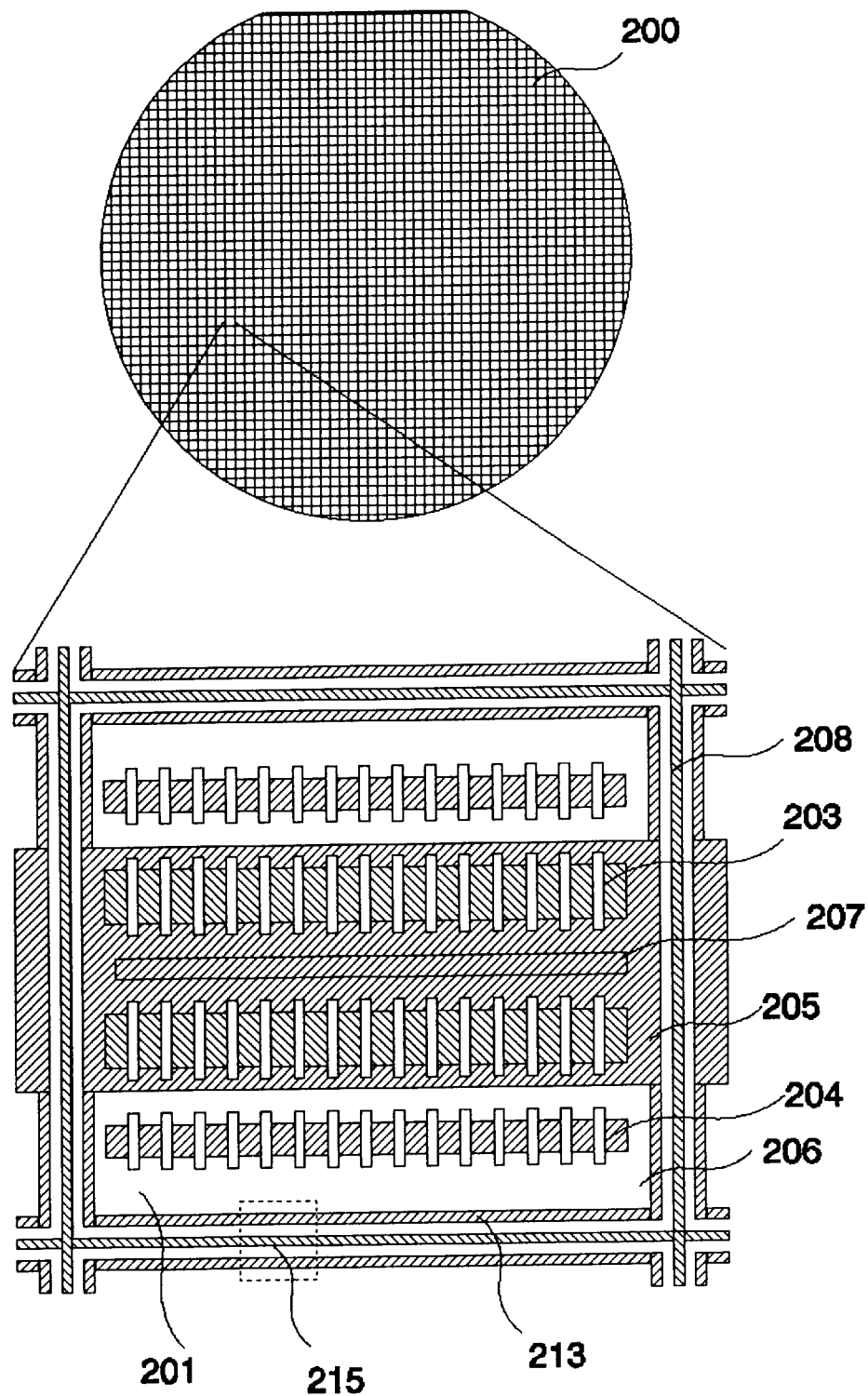
FIG. 2(a) illustrates the repeating unit structure for a pre-defined module of the present invention.

FIG. 2(a) illustrates a silicon wafer contains pre-defined IC modules of the present invention. The whole wafer (200) is uniformly covered with the same repeating structures at very small repeating distance. For example, a gate array module of the present invention would be completely covered with gate arrays that are basically the same as prior art gate arrays. After front-end processing, there is no difference between a core circuit area and a peripheral area. The function of each area is defined by back-end process. There is no specific areas reserved for peripheral circuits. An example layout of one small repeating unit (201) of the pre-defined module of the present invention is shown in the magnified diagram in FIG. 2(a). P-channel transistors (203) are placed in n-well (205), while n-channel transistors (204) are placed in p-well (206). Heavily doped n-type diffusion ($N_+$) areas (207) are placed in n-well as well tabs. Heavily doped p-type diffusion ($P^+$) areas (208) are placed in p-well as well tabs. The $P^+$well tabs form a repeating rectangular structure with a small repeating distance around 50 $\mu$m. A ring of n-type diffusion areas (213) form a double guard ring structure (215) near the $P^+$well tabs. These diffusion areas are placed in routing areas so that they do not introduce unnecessary waste in silicon area. Using this pre-define circuit module, IC products of the present invention are designed according to the following procedures:

Step 1: Pre-define the front-end masks for the module illustrated in FIG. 2(a). Whenever the IC factory has capacity, we can pre-manufacture wafers by finishing all the pre-defined front-end manufacture processes. Different products will use the same pre-defined masks and the same pre-manufactured wafers.

Figure 2B:
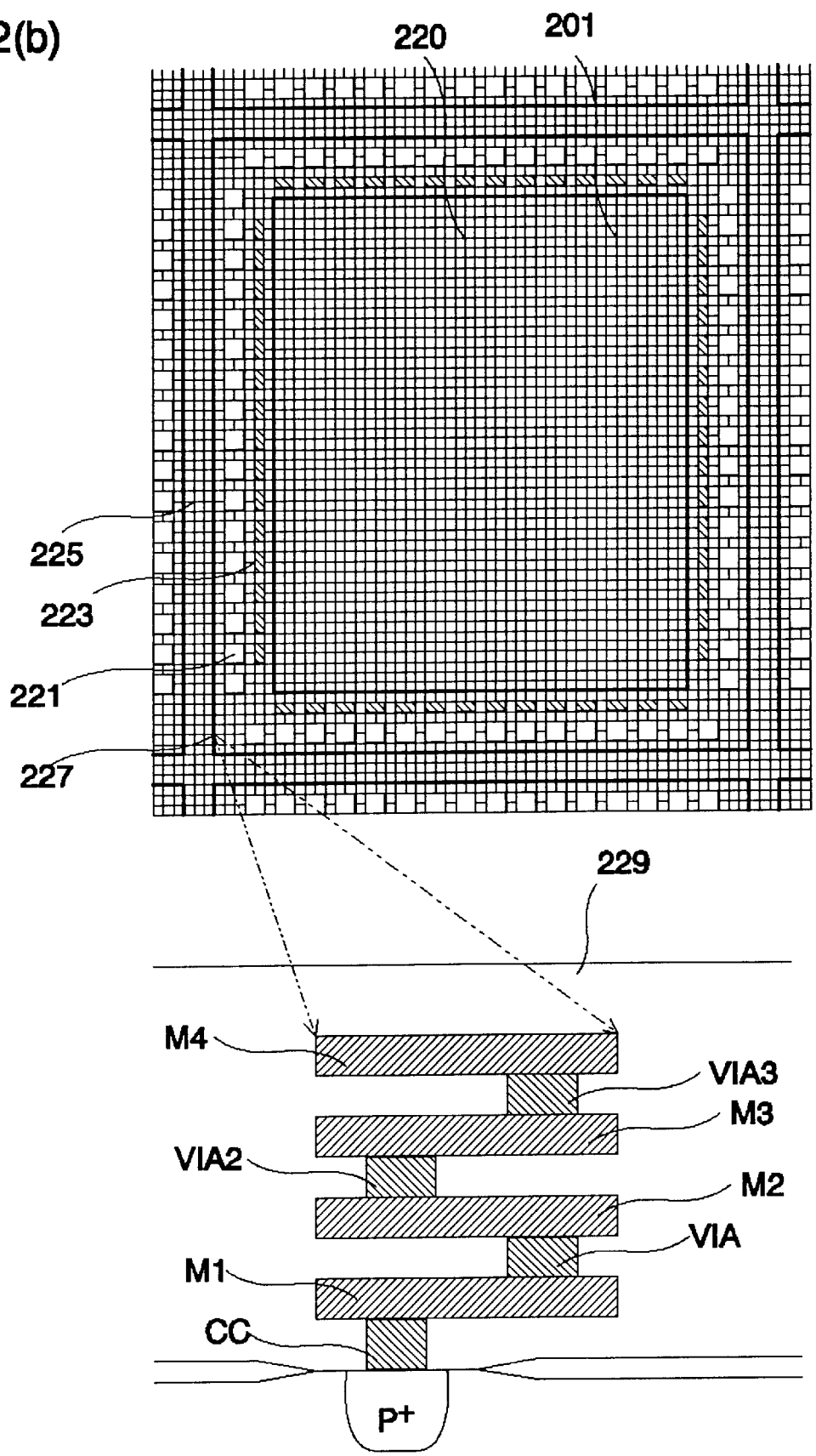
FIG. 2(b) is an example of an IC product made on a pre-defined module of the present invention.

Step 2: Designers define the functions of core circuits, and translate the design into layout. This step is identical to current art IC design procedure. The only difference is that we can use exact number of gates to implement the desired logic circuit. There is no need to waste any gates just to fit a pre-defined module. FIG. 2(b) illustrates the resulting core circuit (220) that is built by adding metal layers to the repeating units (201) of the pre-defined module in FIG. 2(a). In FIG. 2(b), each rectangle (201) represents a repeating unit illustrated in FIG. 2(a).

Step 3: Layout designers Place I/O circuits (223) and bonding pads (221) at desired locations. The I/O circuits are implemented using the transistors in the same repeating units (201) used for core circuits. The double guard ring structure (215) described in FIG. 2(a) comes in handy for latch-up protection. The bonding pads (221) are placed on top of unused repeating units (201) so that there is no difference in terms of front-end processing between bonding pad areas and core circuit areas.

Step 4: Place metal seal rings (227) around the chip, and reserve areas for scribe lanes (225). The scribe lane (225) areas are placed on unused repeating units. In terms of front-end processes, there is no difference between scribe lane areas (225) and core circuit areas (200). The magnified cross-section structure of the seal ring (227) is shown in FIG. 2(b). We assume 4 layers of metals are used in this example. The seal ring is composed of metal 4 (M4), metal 4 to metal 3 via (VIA3), metal 3 (M3), metal 3 to metal 2 via (VIA2), metal 2 (M2), metal 2 to metal 1 via (VIA), metal 1 (M1), and metal 1 to diffusion contact (CC). The top of the chip is covered with a waterproof passivation oxide (229). These stacked metal layers form a complete metal wall to prevent moisture induced reliability problems. This metal wall seal ring (227) is placed along the rectangular $P^+$ well tabs (208) on the boundaries of repeating units; there is no need to have special front-end layout structure reserved for the seal ring.

Step 5: Execute the back-end processing according to layouts generated by steps 2–4 to finish the product. All the components used by the chip, including core circuits (220), I/O devices (223), bounding pads (221), seal rings (227), scribe lanes (225), are all built on areas with the same pre-defined front-end layout. All the components are defined by back-end layouts; none of them need different front-end layouts. Therefore, there is no limitation on the number of gates or the number of I/O devices for any products that share the pre-defined modules.

The above design methods of the present invention have many advantages. IC designs can build all kinds of products with completely different logic functions on the same pre-manufactured wafers. The frond-end procedures and layouts are exactly the same for all the products because all the difference can be implemented by back-end layouts. Therefore, all the products can share the same front-end masks for cost savings, and start from pre-manufactured wafers to save time. Each product can use exact number of gates and exact number of I/O devices, so that there will be no waste. The resulting product will be ready for mass production. There is no need to spend money for a complete set of mask for mass production. Current art IC manufacture technologies need to support infinite kinds of layouts. Using this approach, the IC manufacturers only need to build one kind of layout structure for all the front-end procedures. It is therefore possible to use much more aggressive design rules to reduce product areas. We also can expect higher performance and better yield because we only need to improve the manufacture procedures for one type of geometry.

While specific embodiments of the invention have been illustrated and described herein, it is realized that other modifications and changes will occur to those skilled in the art. For example, there will be a wide variety of methods to define the basic repeating structures. In our example, the p-well tab is arranged as rectangular structure to provide locations for seal rings. It is also possible to implement similar structures using the n-well tabs. The same methodology can be implement for gate arrays, memory devices, I/O devices, programmable logic arrays (PLA), read-only memory (ROM) devices, or a mixture of different types of IC circuits. It should be understood that the above particular examples are for demonstration only and are not intended as limitation on the present invention.

The above pre-defined IC modules of the present invention allow unprecedented flexibility to adapt for different products. The same module can be used by a wide variety of products without sacrificing silicon areas for any one individual product. The utilization efficiencies for the core circuits and for the I/O structures are by far better than prior art approaches. However, there are still rooms to achieve even higher efficiency.

The design methods in previous example allow full flexibility in selecting number of gates, but the IC module has a fixed ratio between p-channel and n-channel transistors (P/N ratio). That is usually not a problem. The number of gates needed by a particular customer is very difficult to predict. However, the P/N ratios for different products usually are about the same. Currently, IC manufacturers provide standard cell libraries to their customers. Based on the utilization records of the standard cell libraries, it is very easy to define a P/N ratio that will fit the needs of almost all customers. However, there will be special cases when a customer has a chip that has unusual P/N ratio. For example, an IC using dynamic logic circuits will use more n-channel transistors. The design methods of the present invention provide options to adjust the P/N ratio for individual customers. For example, to decrease the P/N ratio, we need to convert some of the p-channel transistors into n-channel transistors. That will require changes in well masks and diffusion masks that are low cost masks which do not require high resolution. In the mean time, the high cost masks for polysilicon (poly) and active areas remain the same. For certain special cases, it is beneficial to use optional masks to change the P/N ratio. The cost saving can be more significant if there are other customers designing products with similar P/N ratio. We can define another standard module that shares many masks with the original standard module, while only change a few masks. This example in changing P/N ratio illustrates that optional changes can be used for special requirements for special IC designs, while the present invention still can provide significant cost saving by sharing part of the front-end masks. When optional masks are required, IC products of the present invention are designed according to the following procedures:

Step 1: Finish the front-end manufacture process until the first optional mask is needed. Wafers can be pre-manufactured and held at this point.

Step 2: Designers define the product, and translate the design into layout. This step is identical to current art IC design procedure. The only difference is that a few pre-defined masks are used for cost saving purpose.

Step 3: Layout designers place I/O circuits and bonding pads at desired locations. The I/O circuits are implemented using the transistors in the core modules. The bonding pads (221) are placed on top of unused repeating units. In this way, many pre-defined masks still can be used to reduce cost.

Step 4: Place metal seal rings around the chip, and reserve areas for scribe lanes. Again, most pre-defined masks remain unchanged.

Step 5: Execute the remaining processing according to layouts generated by steps 2–4 to finish the product. Optional masks, pre-defined masks, and product-dependent back-end masks are combined to define the final layout of the product.

When optional front-end masks are used for a product, it is more difficult to save time because the pre-manufactured wafers need to stop before the first optional mask is used. However, we still can have significant cost saving by re-using as many pre-defined masks as possible.

Another important area for improvement is in I/O designs. The I/O circuits are the only circuits that need to interact with external environment. Internal IC circuits operated in well-protected environment, while the I/O circuits need to tolerate harsh external environment. Therefore, I/O circuits are very different from internal circuits. The I/O circuits need to be able to tolerate electrical static discharge (ESD). The voltage level of the I/O signals maybe different from the signal levels used by internal circuits. More often than not, the I/O circuits need to tolerate high voltages and high currents. We also need to take pre-cautions for latch-up problems. The metal lines used for I/O devices are wide metal lines. The super-fine metal lines required for high performance logic circuits are wasteful for I/O design. One or two layers of metal with loose design rules are more than enough for I/O devices. The I/O circuits prefer to use long channel transistors. The super-fast short channel transistors provided by advanced technologies are wasteful for I/O circuits; they actually make I/O design more difficult. That is why current art IC technologies always have special design rules for I/O devices. More often than not, advanced IC technologies need to use additional masks and/or additional manufacture procedures to degrade the performance of transistors to make them suitable for I/O circuits. Using advanced IC technologies to manufacture I/O devices is therefore a waste. For most cases, I/O structures built by out-of-date technologies such as a 0.5 μm technology is better in quality and is by far more cost efficient. All the super-fine manufacture capabilities provided by advanced technologies are not only useless but also harmful for I/O structures.

Figure 3A:
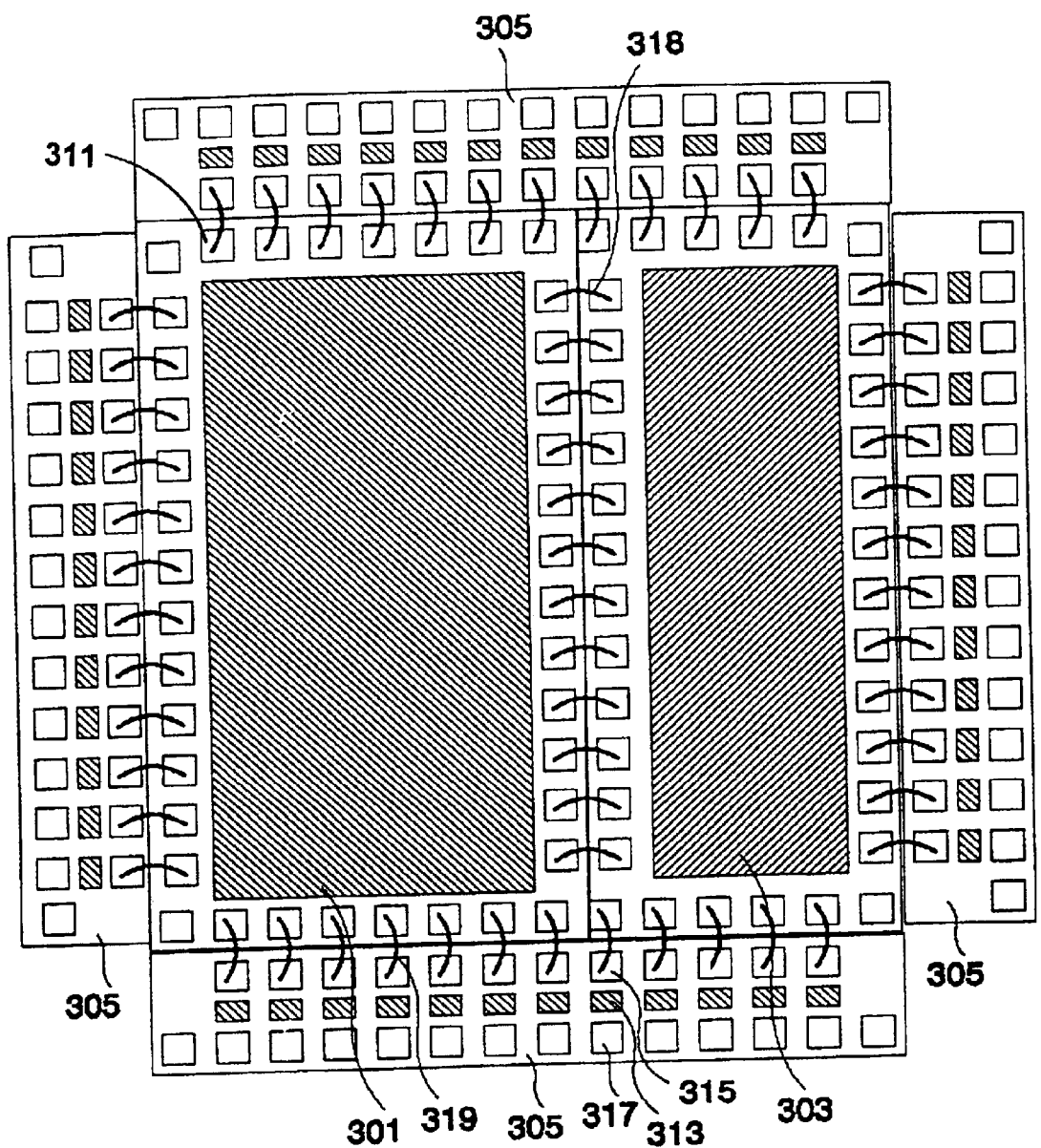
FIG. 3(a) shows the layout of a specialized multiple chip module (SMCM) of the present invention.

The solution for the above problems is to manufacture I/O circuits separately. FIG. 3(a) shows an example of a "specialized multiple chip module (SMCM)" of the present invention. This SMCM comprises core modules such as high performance logic modules (301) and/or memory modules (303). These core modules have bonding pads (311) but they do not have I/O circuits. The I/O circuits are manufactured separately as I/O modules (305). In this example, there are 4 I/O modules. Each I/O module contains I/O devices (313), bonding pads for external connections (317), and bonding pads for inter-module connections (315). The I/O signals of the core modules are connected to I/O modules through inter-module connections (319). The core module I/O signals are buffered by the I/O devices (313) in the I/O modules (305) so that they are not exposed to external environments. Therefore, there is no need to provide special I/O devices in the core modules (301, 303). It is also possible to have inter-module connections (318) between core modules. Each module is made by the most proper IC technology for its specialized requirements. For example, the logic module (301) is made by 0.18 μm 1 layer poly 5 layers metal (1P5M) gate array modules. The memory chip (303) is made by 0.18 μm 4 layers poly 3 layers metal (4P3M) memory technology. The I/O modules (305) are made by 0.5 μm 1 layer poly 2 layers metal (1P2M) technology. All those chips can be designed by the above cost/time saving methods of the present invention except that we no longer need to execute the I/O design step (Step 3). The major difference between this SMCM product and a prior art multiple chip module (MCM) product is that the inputs and outputs of core modules (301, 303) do not directly connect to external pins with a few possible exceptions such as power and clock connections. The IC modules that have no or few conventional I/O devices are called "pinless" modules in the following discussions. Pinless modules of the present invention communicate to nearby modules using "inter-module connections (IMC)" (318,319). The external I/O signals needed by the pinless modules (301, 303) are buffered by the I/O devices (313) in the I/O modules (305). IMC do not need to worry about high current, high voltage, ESD, or latch-up problems. Simple circuits comprise common transistors are enough to support IMC. All the ESD and latch-up protection structures and all the high voltage circuits are placed on the I/O modules.

The SMCM product in FIG. 3(a) has many advantages over prior art IC products. First of all, we waste no areas to build I/O devices with advanced technologies. The I/O devices are built by low cost technologies while achieving better quality. The I/O devices are also completely isolated from core circuits, significantly reduces the chance for noise problems. The core modules are built by technologies optimized for their functions. No special masks or processes are needed to adapt for I/O requirements. Except for the areas used for power pads, scribe lanes and seal rings, all the areas on the core modules are fully utilized. The utilization rate for core circuit modules is therefore extremely high. The total cost for a SMCM is lower than the cost to make one chip because I/O devices are no longer occupying areas on high cost technologies.

The major challenge for SMCM product is yield problem. Assume that the SMCM in FIG. 3(a) has 256 pins. That means we need to have at least 256 inter-module connections (IMC) just to connection core modules to the I/O circuits. Each IMC has two connections. There will be at least 3×256=768 instead of 256 package level connections. We may need additional connections for IMC between core modules. The inter-module connections (318, 319) drawings in FIG. 3(a) are over simplified. In reality, the connections can be quite complex. Higher numbers of connections not only increase packaging cost, but also introduce yield problems. Any one of those connections fail, the whole SMCM product fails. It is therefore necessary to provide reliable methods for inter-module connections.

Figure 3B:
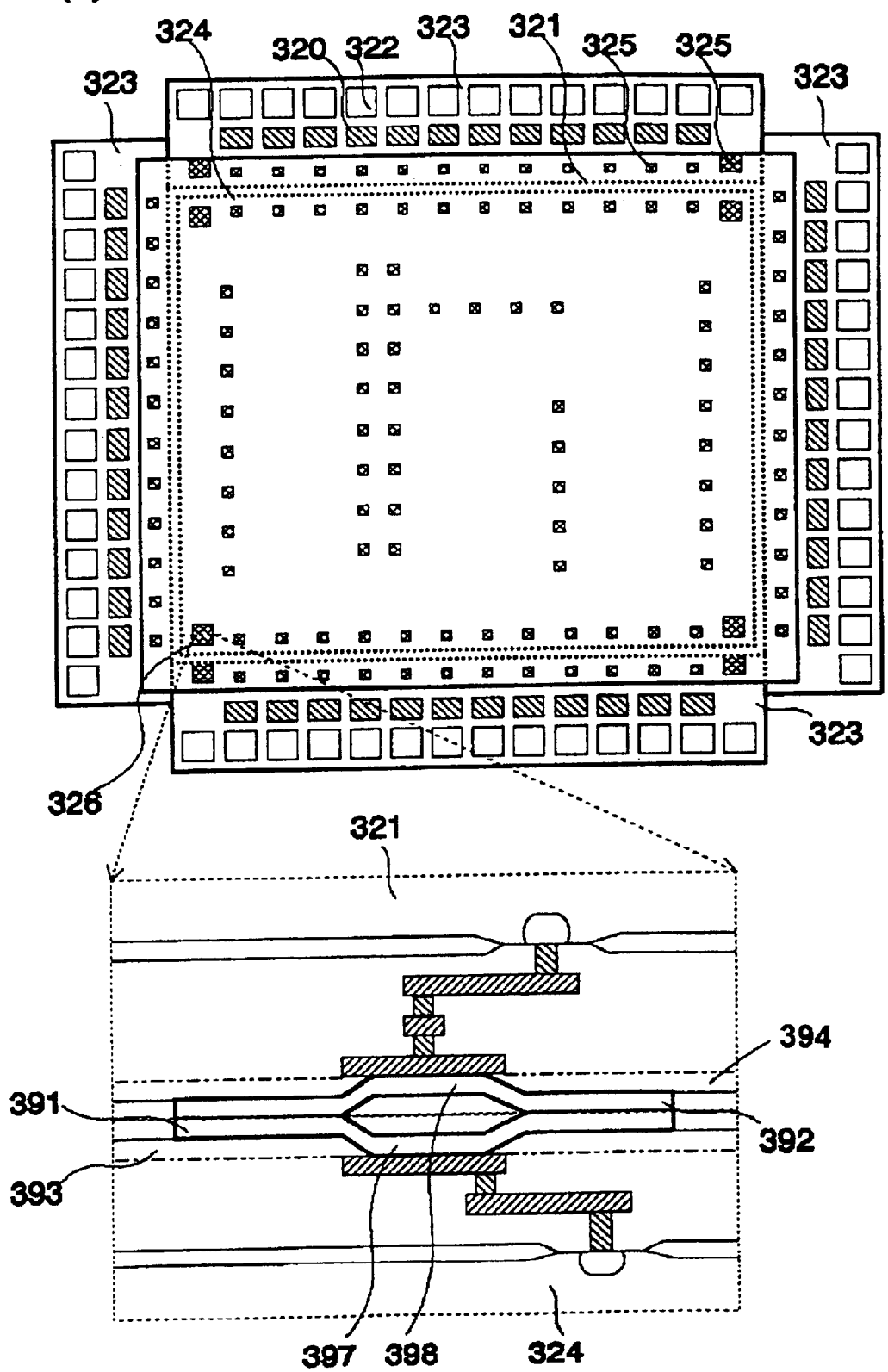
FIG. 3(b) shows the layout of an SMCM using inter-module connections (IMC) of the present invention.

One possible solution is to connect a large number of IMC simultaneously, instead of making the connections one by one. FIG. 3(b) illustrates an example of the simultaneous inter-module connection method of the present invention. A core module (321) is flipped upside down to face I/O modules (323) and other modules (324) so that IMC contact points (325) in those modules can touch each other. The I/O modules (323) has I/O devices (320), bonding pads (322) used for external connections, and IMC contact points (325) used for inter-module connections to the top module (321). In this example, another core module (324) is also placed under the top module (321). This bottom core module (324) is connected to the top module (321) through many IMC contact points (325). These IMC contact points (325) can be placed anywhere under the top module. They also can have different sizes. The IMC points used for power connections should be larger, while those used for signals can be smaller. Since the location of those contact points are defined by lithography, which is by far more accurate than mechanical bonding machines, the dimension of each IMC contact point (325) can be much smaller than bonding pads (322) used for external connections. The magnified cross-section picture for one of the IMC contact point (326) is also shown in FIG. 3(b). The IMC contact point of the bottom module (324) is made of a metal plate (391) deposited on top of the passivation layer (393) of the bottom module (324). This post-passivation metal (PPM) plate (391) connects to the bottom module through a passivation opening (397). Similarly, the IMC contact point (326) of the top module (321) is made of a metal plate (392) deposited on top of the passivation layer (394) of the top module (321). This PPM plate (392) connects to the top module through a passivation opening (398). During the assembly procedures, all the IMC contact points on the top module (321) will contact all the contact points on the bottom modules (323, 324) simultaneously. We can simply heat up the modules to create permanent connections for all IMC on all modules. This method avoids the need to make large number of individual package level connections. However, it is still likely that one of the IMC contact points may not be connected perfectly due to thickness differences at different locations or particle problems. It is therefore necessary to provide methods to tolerate potential connection failures.

Figure 3C:
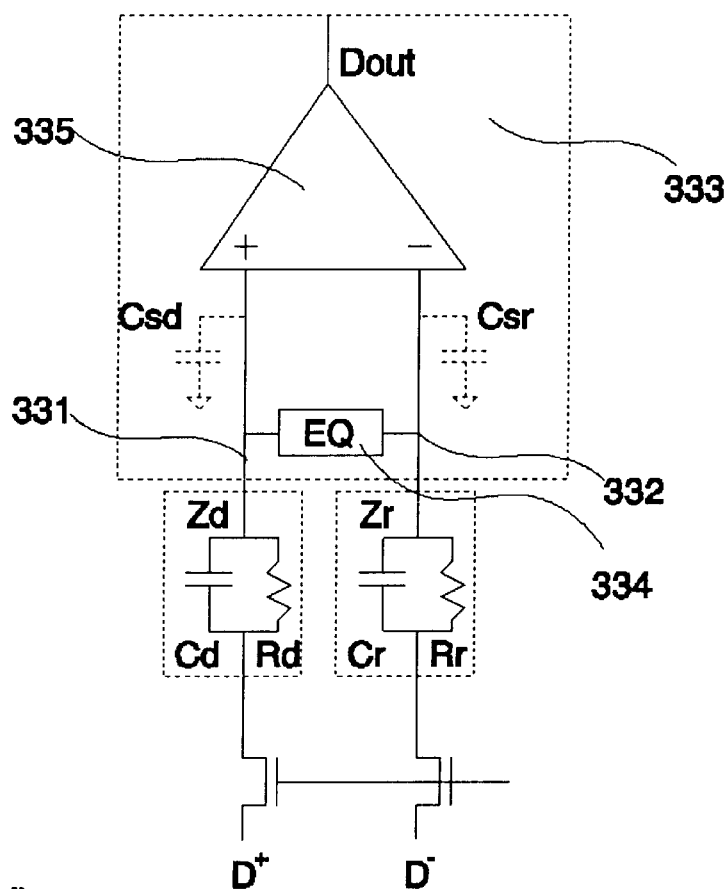
FIG. 3(c) is the schematic block diagram for an input/output circuit supporting IMC of the present invention.

FIG. 3(c) shows an I/O circuit designed for inter-modules connections of the present invention. Data are transferred in differential format using two signal lines—the data line (331) and the reference line (332). The impedance of the data line (Zd) inter-module connection is modeled by a resistor (Rd) connected in parallel to a capacitor (Cd). For a perfect connection, Rd=0. For a bad connection, Rd is very large, and the inter-module connection behaves as a capacitor (Cd) created by face-to-face metal plates. Similarly, the impedance of the reference line (Zr) inter-module connection is modeled by a resistor (Rr) connected in parallel to a capacitor (Cr). To receive data from these inter-module lines (331, 332), the receiver is equipped with a small signal sensing circuit (333). This sensing circuit comprises an equalization circuit (334) and a small signal sense amplifier (335). At idle state, the equalization circuit (334) equalizes the voltages on the data line and the reference line. During a data transfer period, the equalization circuit (334) is turned off, and a differential data set ($D^+$ and $D^-$) is placed on the data line and the reference line. To represent a binary data '1', $D^+$ goes up by an amplitude Am, while $D^-$ goes down by the same amplitude. To represent a binary data '0', $D^+$ goes down by an amplitude Am, while $D^-$ goes up by the same amplitude. The sense amplifier (335) is enabled after the data is ready, and provides output data (Dout) to internal circuits in the receiver module.

When connections for both of the inter-module lines (331, 332) are perfect, the differential amplitude of the input signal to the sense amplifier would be 2*Am. The sense amplifier (335) will have no problem detecting the right data. If the data line (331) has a bad connection, the signal reaches the sense amplifier along data line would be (Cd/Csd)*Am, where Csd is the equivalent loading capacitance seen by the sense amplifier, and Cd is the equivalent capacitor of the broken data line. Under this situation, the differential amplitude of the input signal to the sense amplifier would be (1+Cd/Csd)*Am. The sense amplifier (335) still has no problem detecting the right data under this condition. Similarly, when the reference line is broken, the differential amplitude of the input signal to the sense amplifier would be (1+Cr/Csr)*Am, where Csr is the equivalent loading capacitance seen by the sense amplifier, and Cr is the equivalent capacitor of the broken reference line. There is no problem for the sense amplifier under this condition. When both lines are broken, the differential amplitude of the input signal to the sense amplifier would be (Cd/Csd+Cr/Csr)*Am. A current art small signal sense amplifier can detect voltage difference less than 0.01 volts. If Am equals 1 volt, the data transfer circuit can tolerate the situation when both lines are broken as soon as (Cd/Csd+Cr/Csr)>0.01. That condition is extremely easy to meet so that the sense amplifier (335) will have no problem in detecting the right data even when both lines are broken. We will have excellent yield for inter-module connections if the method in FIG. 3(a) is used. There are many methods to implement such small signal sensing circuits. For example, the reference data line can be shared by many sensors, while its voltage remain unchanged. It is also possible to use single-end sensing that only one IMC is needed for one inter-module signal.

Figure 3D:
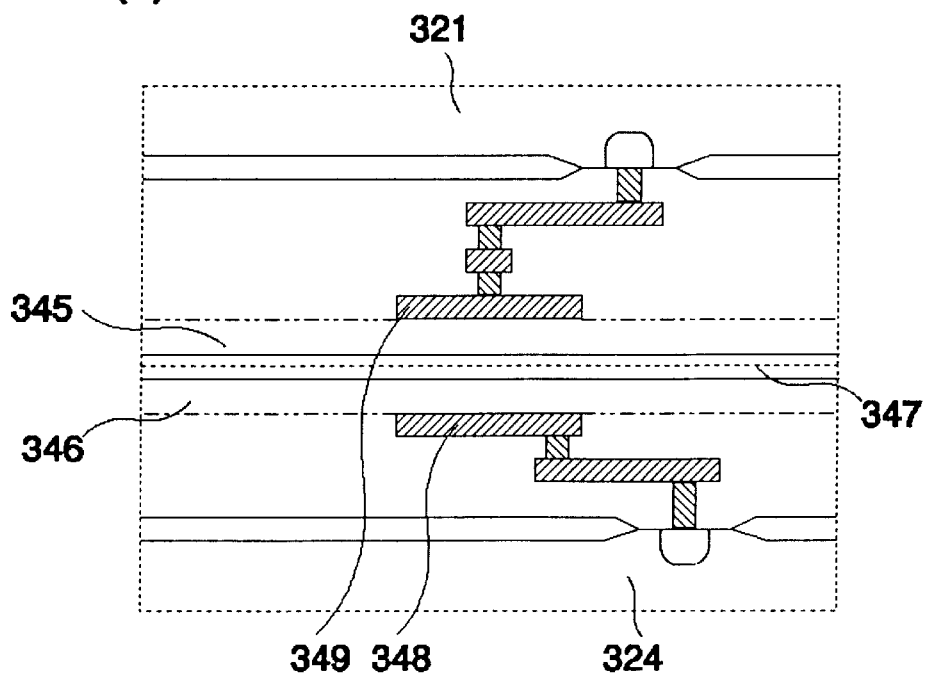
FIG. 3(d) shows the structure for a contactless IMC of the present invention.

In many cases, we actually prefer not to have direct connections. FIG. 3(d) shows an example of contactless inter-module connection of the present invention. In this example, the inter-module connection contact point of the top module (321) does not have direct connection to the inter-module connection contact point of the bottom module (324). The two metal plates are separated by passivation layers (345, 346) and void space (347). The void space (347) may exist because of uneven thickness or defective connection. The metal plates of the two contact points (348, 349) form a capacitor that is large enough to support data transfer circuit in FIG. 3(a). These contactless connections have many advantages. There is no need to use an additional metal layer for this type of connections. The cost is lower. The inter-module connections can be placed anywhere in the chip while occupying small areas. Different modules are separated completely so that each module can operate at different power supplier voltages without any problem. The chance for noise problem is also reduced.

Figure 4A:
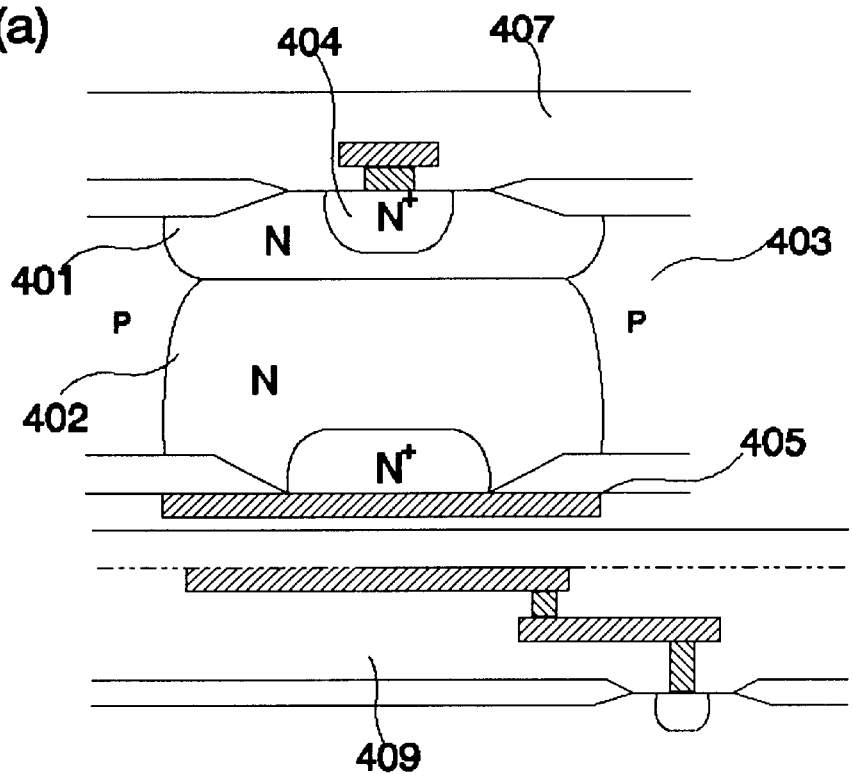
FIG. 4(a) shows the structure for a through substrate connection (TSC) of the present invention.

Another novel method to form inter-module connection is to send the signal through the substrate as shown in FIGS. 4(a–b). These through substrate connections (TSC) can be a resistor path, a capacitor path, or a combination of both resistor and capacitor path. The example in FIG. 4(a) is using n-type diffusion areas (401, 402) in a p-type substrate (403) as a resistor type TSC. In this example, an n-type diffusion area (402) starts from bottom to surface, touching another n-type diffusion region (401) to form a diffusion resistor penetrating through the p type semiconductor substrate (403). This n-type diffusion TSC connects to the circuits on the top module (407) through a diffusion contact (404). It also connects to a bottom electrode (405). The bottom diffusion area (402) can be manufactured through back-side diffusion. The top diffusion area (401) can be an isolated n-well. The top module (407) equipped with this TSC can be placed on top of a bottom module (409) to form inter-module connection as illustrated by FIG. 4(a). The IMC structure of the bottom module (409) in this example is the same as the bottom module (324) in FIG. 3(d). A contactless IMC is formed between these two modules (407, 409) as illustrated in FIG. 4(a). The bottom module also can have other types of IMC structures such as the one in FIG. 3(b). Naturally, the small signal sensing circuits in FIG. 3(c) can be used to support these novel inter-module connections. FIG. 4(a) is simplified for clarity; the structures in the diagram are not drawn to scale. The bottom diffusion region (402) is usually much larger than the top diffusion region (401).

Figure 4B:
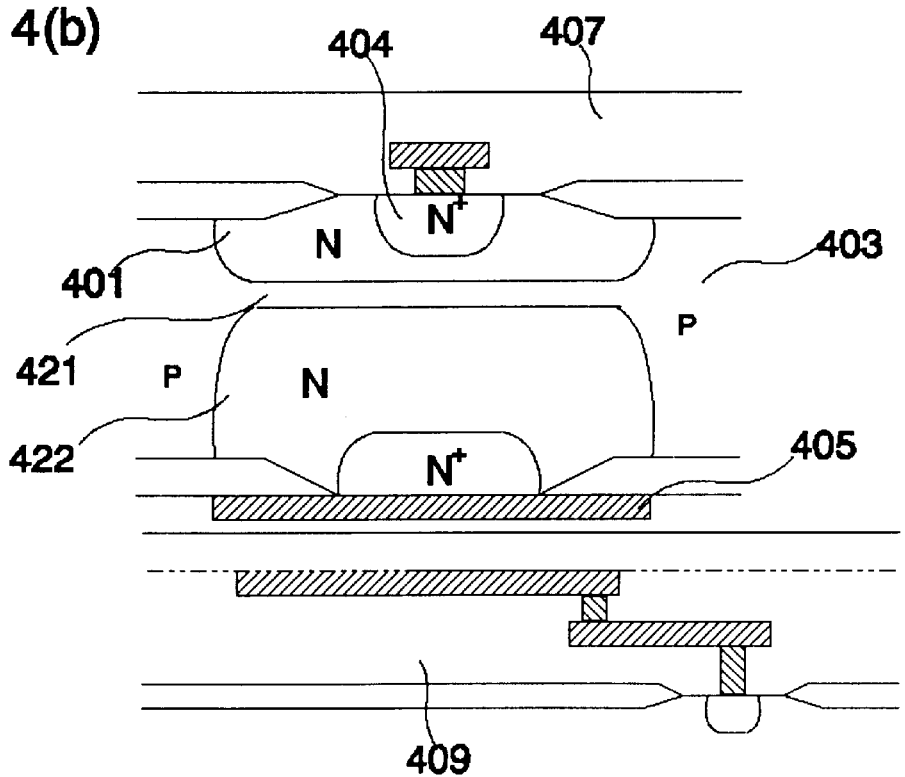
FIG. 4(b) shows the structure for another TSC of the present invention.

Another example of TSC is shown in FIG. 4(b). This TSC is similar to the example in FIG. 4(a) except that there is a p-type region (421) between two n-type regions (401, 422). This structure behaves as two back to back diodes. Both diodes are off, but transient signals can pass through them because those diodes behave like capacitors. A module equipped with TSC can be placed on top of another module to form inter-module connections in the same way as the example in FIG. 4(a).

These TSC connections are not only useful as inter-module connections. They can be used as back-side connections to other chips on the same wafer, or used for testing purpose. To manufacture TSC require additional manufacture processes and additional masks. It is desirable to place these TSC at pre-defined locations for cost sharing. TSC allows bottom to face stacking of modules that is very convenient if the top module has external pin connections.

The SMCM products described above still have one major problem—testing. They do not have common I/O devices to accept or to provide external signals. Conventional testing methods can not test IC chips without I/O devices. If we test after the SMCM is assembled, the failure rate will be the compounded failure rates of all components. The penalty for a failure will be the total cost of the whole packaged MCM product. Such product will not be practical. It is therefore necessary to provide practical method to test those modules before they are assembled.

Figure 5A:
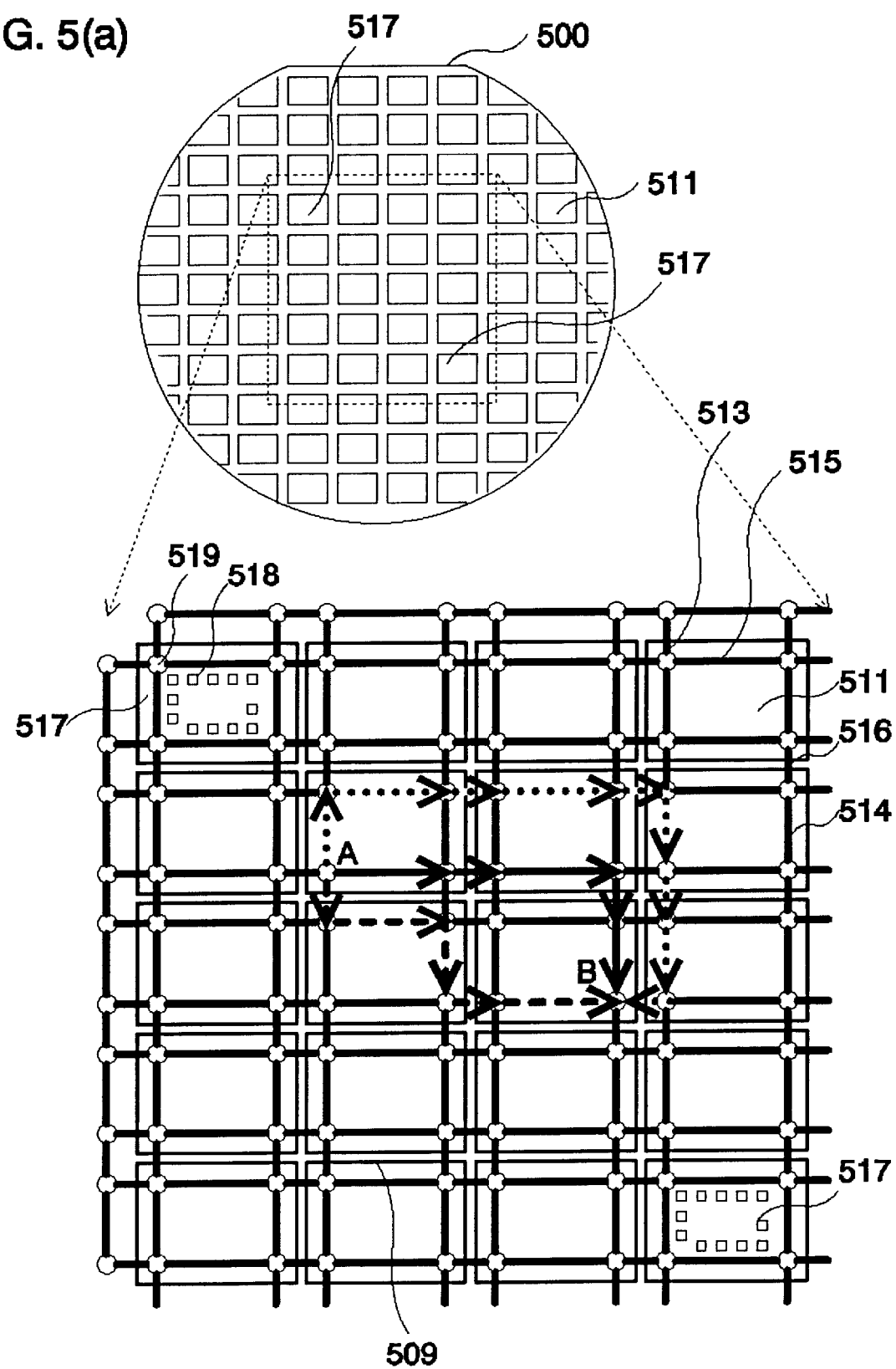
FIG. 5(a) is an overview for a scan network of the present invention.
Figure 5B:
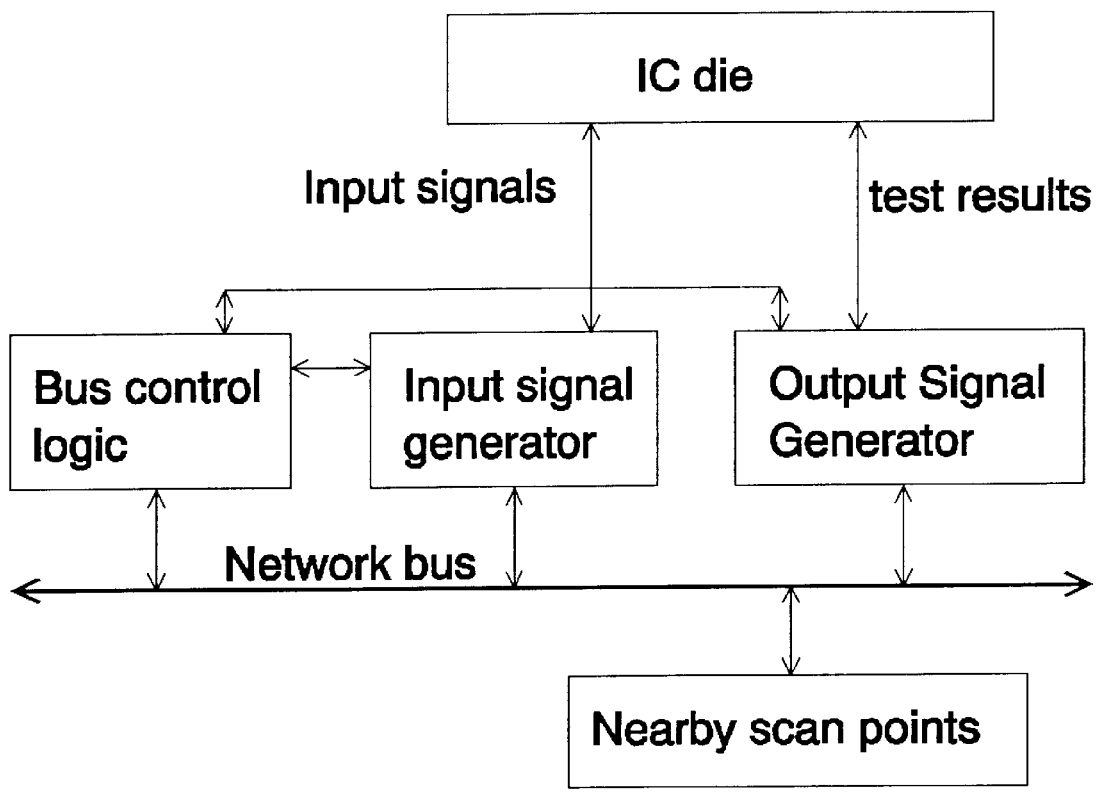
FIG. 5(b) is a block diagram for a scan point of the present invention.
Figure 5C:
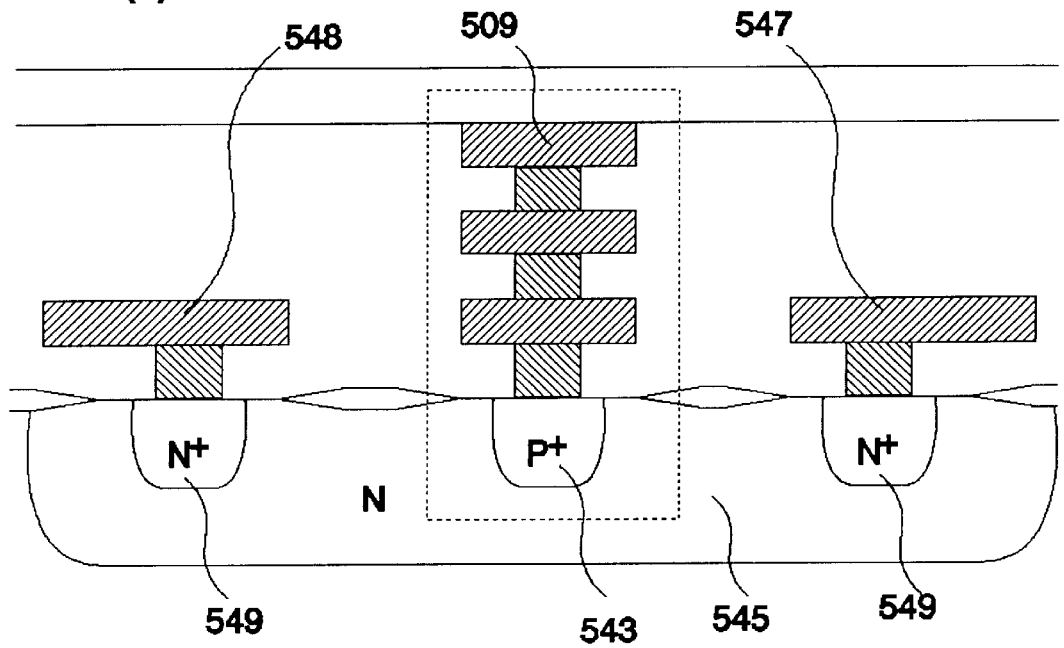
FIG. 5(c) illustrates the cross-section structure of a inter-dice connection (IDC) of the present invention.
Figure 5D:
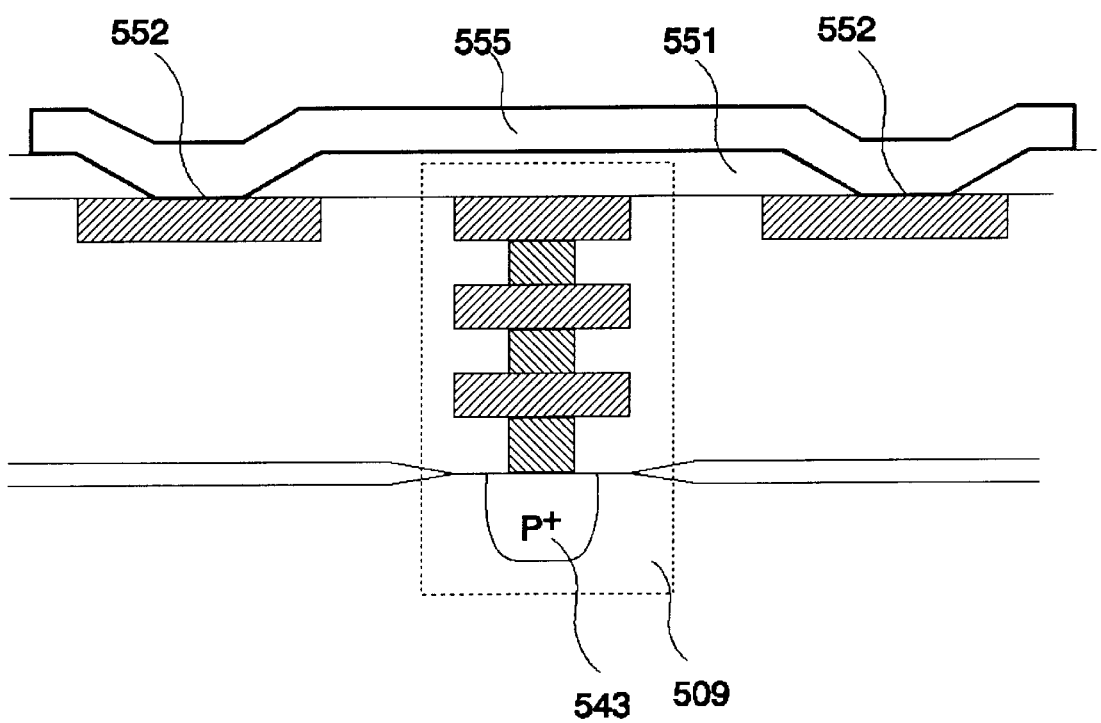
FIG. 5(d) illustrates the cross-section structure of another IDC of the present invention.

This invention provides a solution called "scan network" testing method for the above problem. A wafer (500) contains a plurality of IC dice (511) as shown in FIG. 5(a). In a scan network, each IC die (511) contains one or more scan points (513) as shown by the magnified diagram in FIG. 5(a). Each scan point (513) can communicate with one or more nearby scan points using network buses (514, 515,) that are represented by thick lines because each network bus contains a large number of signal lines. These network buses (514, 515) can travel within a die (511), they also can travel across dice boundaries (516). A connection crossing dice boundaries (516) are called inter-dice connection (IDC) in the present invention. A scan point is a control circuit unit; the building blocks of a typical scan point are shown in FIG. 5(*b*). A scan point always has a bus control logic that controls the signal transfer activities on the network buses. The scan point also has an input signal generator that generates input signals to control the activities of the IC die. These input signals are generated based on the signals obtained from the network buses and/or the signals provided by the IC itself. The scan point also has an output signal generator that generated outputs to the network buses. This output signal generator monitors the activities on the IC die, accepts control parameters from the network buses, then drives output signals to the network buses according to those input signals. An extreme example of a scan network is a scan chain. In a scan chain, each scan point is a shift register. The data stored in the shift register is passed to one and only one nearby shift register. Input and output signals can pass along such a chain in one dimension. The problem for a scan chain is that the whole chain will not work if one element of the chain is broken. The data transfer rate for a scan chain is also low. In a scan network of the present invention, each scan point (513) is connected to more than one other scan points by parallel point to point network buses (514–515). There are multiple passes to transfer data to a particular scan point as illustrate by the example in FIG. 5(*a*). In this example, three different paths marked by different arrow signals can be selected to transfer data between scan point A and scan point B. In a scan network, failures on a few buses or scan points will not shut down the whole network. We can find multiple ways to access a particular scan point we need. The data transfer rate between nearby scan points can be very high. Because the distance between nearby scan points is short. Current art bus control logic can transfer data at billions of bits per second for each individual line. A wide parallel bus can transfer data at extremely high data rate. In addition, a scan network can have multiple bus activities simultaneously. The total active data transfer rate for a wafer level scan network can easily exceed trillion bits per second. A scan network of the present invention provides extremely high data transfer rate with excellent flexibility and fault tolerance. It is therefore ideal to execute testing activities for circuit modules of the present invention. In each wafer, a few special dice (517) are placed in the same way as prior art drop-in test patterns. These special dice contains probe points (518) to receive external signal connection. It also has a mother scan point (519) that is connected to the scan network. Current art testers can be connected to the probe points (518) through a probe card or bonding pins. When we want to test a particular die on the wafer. A tester sends test vectors to the mother scan point (519) through the probe points (518). The test vectors are sent to the target die using the scan network. The testing results are also sent back to the tester through the scan network. The input path and the output path are not necessary the same. There are always multiple paths available to and from the target. If one of the path is not available due to broken components or simply because the path is busy, the test program always can find another path to test the target die. Since the scan network has extremely high data transfer rates, the tests can be executed at extremely high efficiency. Using the scan network, we also can execute tests on multiple dice simultaneously or sequentially without moving the probing device. This testing method is therefore more efficient and more reliable than prior art testing methods.

To establish the wafer level scan network in FIG. 5(*a*), we need to have inter-dice connections (516) in order to connect scan points in different dice. An inter-dice connection defined in this invention is a conducting line between two nearby IC dice that is used to transfer signal from one dice to a nearby dice. We do not consider a long line connecting multiple dice as an inter-dice connection in the present invention. Such inter-dice connection needs to pass through the boundaries of nearby IC dice. The dice boundaries are surrounded by seal rings (509). As illustrated in FIG. 2(*b*), the seal ring is a metal wall built from all the available metal layers and contacts. The seal ring is therefore a barrier for metal lines. FIG. 5(*c*) shows one method to pass through a seal ring without using additional manufacture processes. In this example, the seal ring (509) is connected to a p-type diffusion area (543) in substrate. An n-type diffusion (545) area (for example, an n-well) penetrates underneath the p-type diffusion area (543) to both sides of the seal ring (509). A metal line (547) to the right of the seal ring can be connected to a metal line (548) to the left of the seal ring using N+diffusion contacts (549) connected to the n-type diffusion area (545). The resistance of such diffusion connection is much higher than simple metal line connection. This resistance is usually not a problem when the distance is short. For the case when the diffusion resistance is a problem, we can use one extra metal layer for the IDC as shown in FIG. 5(*d*). Windows (552) on the passivation layer (551) are opened on top of metal lines at both sides of a seal ring (509). A post passivation metal layer (555) is deposited on top of the chip as inter-dice connection. The dimension of the above inter-dice connection of the present invention can be very small. We can have thousands of such connections between two nearby dice. The inter-dice connections only need to travel a few hundred $\mu$m to the nearby dice. The bandwidth for such short line is very high. Current art IC can easily transfer billions of bits per second through one inter-dice connection. The total data transfer rate for an inter-dice signal bus of the present invention can easily reach trillions of bits per second.

The scan network of the present invention has significant advantages over prior art methods. A prior art wafer level testing system moves a probe card to each die on the wafer using a high cost probe station. All the dice on the wafer must have bonding pads and I/O devices to be tested. The prior art system simply can not test the special modules of the present invention that do not have conventional I/O devices. The scan network of the present invention is able to test all the dice on the wafer without moving the probe card. It also can test multiple dice simultaneously. The scan network is therefore not only useful to test products without convention I/O devices. It is actually better than conventional wafer level testing methods in cost and in efficiency. It is therefore also useful for testing conventional IC products.

There are prior art inventions that provide wafer level connections for testing the whole wafer without moving a probe. Those methods use long connection lines to connect many dices. The loading on a long metal line is high, so that those prior art systems only can operate at very low frequency. These long metal lines require extra manufacture procedures, which increase the cost. The number of lines available is also limited. The total data transfer rate for the prior art inventions are so low that testing time can introduce significant cost problems. The most important problem of those prior art systems is fault tolerance. The chance for a long connection line to have defects is very high. The yields of the prior art testing systems are so bad that it is pointless to use them to determine the yields of products. That is the major reason why none of the prior art inventions are applicable to practical products. The scan network of the present invention use short connections between scan points. All the supporting circuits and connections are part of the IC products. There is no need to use extra manufacture processes to build the scan network system. There are always multiple passes available to transfer signals from one point to the other points. The system of the present invention has excellent fault tolerance. The inter-dice connections of the present invention allow the possibility to transfer trillions of bits per second. The two-dimensional network also allows multiple simultaneous activities. This data transfer method of the present invention is so efficient that it can be used to support actual data transfer of real product functions. The advantage is especially significant for system-on-a-chip (SOC) products that use multiple dice on the wafer as one product.

While specific embodiments of the invention have been illustrated and described herein, it is realized that other modifications and changes will occur to those skilled in the art. For example, the probe points connected to the scan network of the present invention do not need to occupy special dice. The probe points can be placed on scribe lanes or any part of the wafer. It is also possible to use any one of the scan point in one of the dice as the mother scan point. It should be understood that the above particular examples are for demonstration only and are not intended as limitation on the present invention. It is therefore to be understood that the appended claims are intended to cover all modifications and changes as fall within the true spirit and scope of the invention.

I claim:

1. A multiple-chip module (MCM) device supported on a semiconductor wafer comprising:
   a core module comprising a plurality of logic circuits having a first layer structure formed by a logic circuit manufacturing process for performing logic functions of said MCM device;
   at least an input/output (I/O) module disposed next to and separate from said core module comprising a plurality of I/O circuits having a second layer structure formed by an I/O circuit manufacturing process for performing input/output functions for said MCM device;
   said core module is flipped to have face-to-face contacts with a plurality of inter-module contact points disposed on said I/O module;
   said core module further comprising a memory module disposed next to and separate from said logic circuits comprising a plurality of memory circuits having a third layer structure formed by a memory circuit manufacturing process for performing a memory storage function for said MCM device; and
   each of said inter-module contact points further comprising a signal sensing means for sensing an inter-module signal transmission.

2. A multiple-chip module (MCM) device supported on a semiconductor wafer comprising:
   a core module comprising a plurality of logic circuits having a first layer structure formed by a logic circuit manufacturing process for performing logic functions of said MCM device;
   at least an input/output (I/O) module disposed next to and separate from said core module comprising a plurality of I/O circuits having a second layer structure formed by an I/O circuit manufacturing process for performing input/output functions for said MCM device;
   said core module further comprising a memory module disposed next to and separate from said logic circuits wherein said memory module comprises a plurality of memory circuits having a third layer structure formed by a memory circuit manufacturing process for performing a memory storage function for said MCM device; and said core module and I/O module are coupled by inter-module contact points, wherein
   each of said inter-module contact points further comprising a signal sensing means for sensing an inter-module signal transmission.

3. The MCM device of claim 2 wherein:
   each of said inter-module contact points receiving signals from said core module through said signal sensing means with no direct physical connection to said core module and I/O module.

4. The MCM device of claim 3 further comprising:
   a plurality of external connecting traces for connecting said I/O module to circuits external to said MCM device.

5. The MCM device of claim 3 further wherein:
   said logic circuits and said memory module further comprising a plurality of bonding pads for forming face-to-face contacts with said plurality of inter-module contact points disposed on said I/O module.

6. A multiple-chip module (MCM) device supported on a semiconductor wafer comprising:
   a core module comprising a plurality of logic circuits having a first layer structure formed by a logic circuit manufacturing process for performing logic functions of said MCM device;
   at least an input/output (I/O) module disposed next to and separate from said core module comprising a plurality of I/O circuits having a second layer structure formed by an I/O circuit manufacturing process for performing input/output functions for said MCM device;
   said core module further comprising a memory module disposed next to and separate from said logic circuits comprising a plurality of memory circuits having a third layer structure formed by a memory circuit manufacturing process for performing a memory storage functions for said MCM device;
   said logic circuits having said first layer structure formed by a one polysilicon layer and five-metal layers (1P5M) manufacturing process; and
   said memory circuits having said third layer structure formed by a four polysilicon layers and three metal layers (4P3M) manufacturing process.

7. A multiple-chip module (MCM) device supported on a semiconductor wafer comprising:
   a core module comprising a plurality of logic circuits having a first layer structure formed by a logic circuit manufacturing process for performing logic functions of said MCM device;
   at least an input/output (I/O) module disposed near and separate from said core module comprising a plurality of I/O circuits having a second layer structure formed by an I/O circuit manufacturing process for performing input/output functions for said MCM device;
   said core module is flipped to have face-to-face contacts with a plurality of inter-module contact points disposed on said I/O module; and
   said I/O circuits having said second layer structure formed by a one polysilicon layer and two-metal layers (1P2M) manufacturing process.

* * * * *